US006829281B2

(12) United States Patent
Deng et al.

(10) Patent No.: US 6,829,281 B2
(45) Date of Patent: Dec. 7, 2004

(54) VERTICAL CAVITY SURFACE EMITTING LASER USING PHOTONIC CRYSTALS

(75) Inventors: Hongyu Deng, Arcadia, CA (US); Thomas Lenosky, Mountain View, CA (US); Jan Lipson, Cupertino, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/175,309

(22) Filed: Jun. 19, 2002

(65) Prior Publication Data

US 2003/0235229 A1 Dec. 25, 2003

(51) Int. Cl.[7] .................................................. H01S 3/08
(52) U.S. Cl. .......................... 372/96; 372/43; 372/44; 372/45; 372/46; 372/47; 372/48; 372/49; 372/50; 372/92; 372/96; 372/99
(58) Field of Search .............................. 372/92, 96, 99, 372/43–50

(56) References Cited

U.S. PATENT DOCUMENTS

| | | | |
|---|---|---|---|
| 5,301,201 A | | 4/1994 | Dutta et al. |
| 5,365,541 A | * | 11/1994 | Bullock ........................ 372/99 |
| 5,625,636 A | | 4/1997 | Bryan et al. |
| 5,684,817 A | | 11/1997 | Houdre et al. |
| 5,804,919 A | * | 9/1998 | Jacobsen et al. ............ 313/506 |
| 5,955,749 A | * | 9/1999 | Joannopoulos et al. ....... 257/98 |
| 6,058,127 A | | 5/2000 | Joannopoulos et al. |
| 6,130,780 A | | 10/2000 | Joannopoulos et al. |
| 6,198,211 B1 | * | 3/2001 | Jaffe et al. ................... 313/461 |
| 6,392,341 B2 | * | 5/2002 | Jacobsen et al. ............ 313/506 |
| 6,404,127 B2 | * | 6/2002 | Jacobsen et al. ............ 313/506 |
| 6,416,575 B2 | * | 7/2002 | Yamada ........................ 117/2 |
| 6,515,305 B2 | * | 2/2003 | Gopinath ..................... 257/79 |
| 6,574,383 B1 | * | 6/2003 | Erchak et al. ................ 385/15 |
| 6,683,898 B2 | * | 1/2004 | Østergaard et al. .......... 372/43 |
| 6,704,343 B2 | * | 3/2004 | Deng et al. ................... 372/97 |
| 2002/0163947 A1 | * | 11/2002 | Ostergaard et al. .......... 372/43 |
| 2002/0167984 A1 | * | 11/2002 | Scherer ........................ 372/50 |

FOREIGN PATENT DOCUMENTS

WO    WO 03/034113 A2 * 4/2003

OTHER PUBLICATIONS

Kent D. Choquette and Aaron J. Danner, "Vertical Cavity Photonic Integrated Circuit" Dept. of Electrical and Computer Engineering University of Illinois, Urbana, IL, pp. 508–510.*

Dae–sung Song, "Single–mode Photonic Crystal VCSEL", Tuesday Afternoon/ CLeo 2002, pp. 293–294.*

Luke J. Mawst, "Coupled VCSEL arrays; Active Photonic Lattices", IEEE,2002, pp. 39–40.*

Eli Kapon, "Coupled VCSEL Arrays; a model system for two dimensional photonic crystal" IEEE/2002,pp. 37–38.*

O. Painter et al., *Two–Dimensional Photonic Band–Gap Defect Mode Laser*, vol. 284, Science, Jun. 11, 1999, pp. 1819–1820.

(List continued on next page.)

Primary Examiner—Min Sun Harvey
Assistant Examiner—Delma R. Flores Ruiz
(74) Attorney, Agent, or Firm—Workman Nydegger

(57) ABSTRACT

A vertical cavity surface emitting laser (VCSEL) using photonic crystals. Photonic crystals are formed such that the active region of the VCSEL is bounded by the photonic crystals. The photonic crystals have a periodic cavity structure that reflects light of certain wavelengths through the active region of the VCSEL such that laser light at the wavelengths is generated. Additional photonic crystals can be formed to increase the bandwidth of the VCSEL. The photonic crystals can also be combined with distributed bragg reflector layers to form the mirrors of a VCSEL.

27 Claims, 2 Drawing Sheets

OTHER PUBLICATIONS

Dae–Sung Song et al., *Single–Fundamental–Mode Photonic–Crystal Vertical–Cavity Surface–emitting Lasers*, Applied Physics Letters, vol. 80, No. 21, May 27, 2002, pp. 3901–3903.

Abstract of Japanese Patent Application No. 09108271.

Abstract of Japanese Patent Application No. 09365886.

M.H. Szymanska et al., *Effect of a Photonic Band Gap on the threshold and Output Power of Solid–State Lasers and Light–Emitting Diodes*, Physical Review Letters, vol. 83, No. 1, Jul. 5, 1999, pp. 70–72.

Masahiro Imada et al, *Coherent Two–Dimensional Lasing Action in Surface–emitting Laser with Triangular–Lattice Photonic Crystal Structure*, Applied Physics Letters, vol. 75, No. 3, Jul. 19, 1999, pp. 316–318.

Alexei A. Erchak et al., *Enhanced Coupling to Vertical Radiation Using a Two–Dimensional Photonic Crystal in a Semiconductor Light–emitting Diode*, Applied Physics Letters, vol. 78, No. 5, Jan. 29, 2001, pp. 563–565.

Kanna Aoki et al., *A Novel Three–Dimensional Photonic Laser and Fabrication of Three–Dimensional Photonic Crystals*, RIKEN Review, No. 33, Mar. 2001, pp. 24–27.

I. Vurgaftman et al., *Photonic–Crystal Distributed–Feedback Lasers*, Applied Physics Letters, vol. 78, No. 11, Mar. 12, 2001, pp. 1475–1477.

Susumu Noda, et al., *Polarization Mode Control of two–Dimensional Photonic Crystal Laser by Unit Cell Structure Design*, Science, vol. 293, Aug. 10, 2001, pp. 1123–1125.

\* cited by examiner

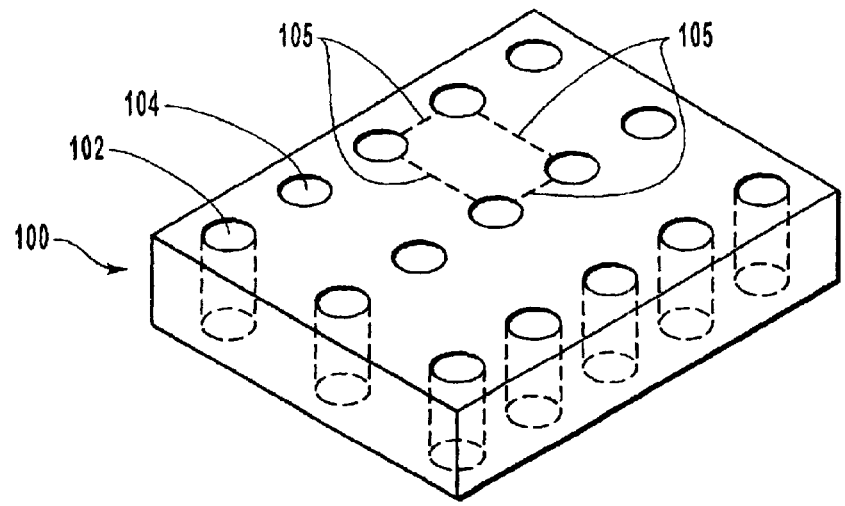
FIG. 1A
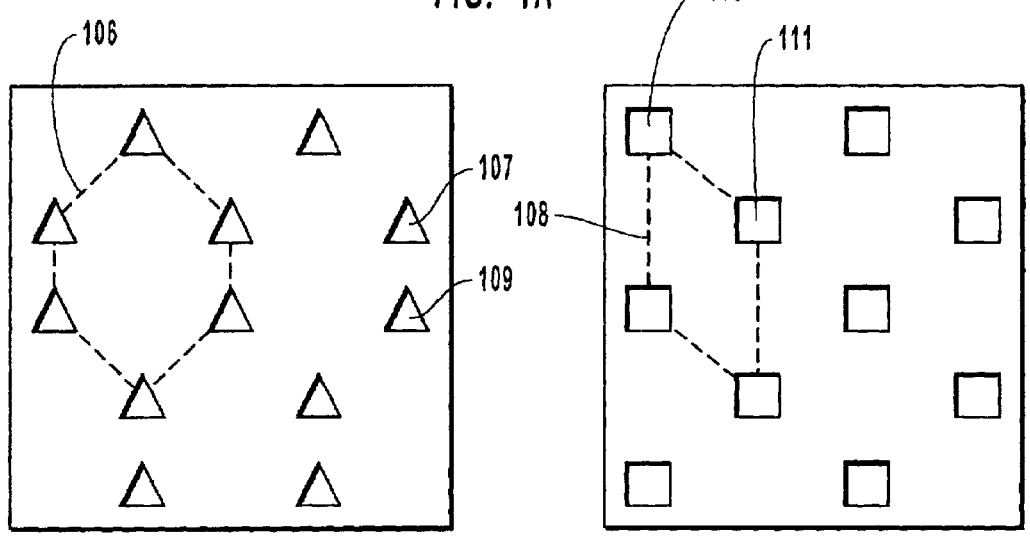
FIG. 1B
FIG. 1C
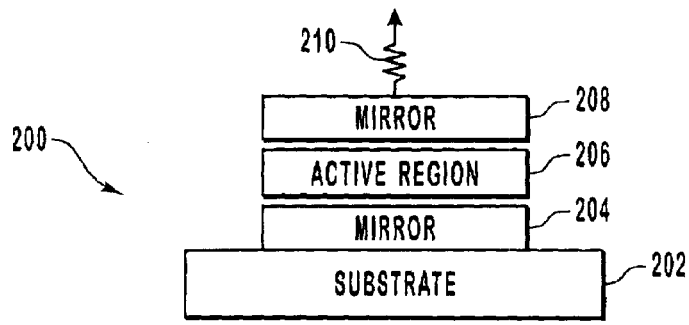
FIG. 2

VERTICAL CAVITY SURFACE EMITTING LASER USING PHOTONIC CRYSTALS

BACKGROUND OF THE INVENTION

1. The Field of the Invention

The present invention relates to vertical cavity surface emitting lasers. More particularly, the present invention relates to vertical cavity surface emitting lasers that use photonic crystals to achieve high energy cavities.

2. Background and Relevant Art

Some of the most commonly used light sources in optical communication systems are semiconductor lasers. Vertical cavity surface emitting lasers (VCSELs) are an example of semiconductor lasers and are used in optical communication systems for several reasons. VCSELs can be manufactured in large quantities due to their relatively small size and can often be tested on a single wafer. VCSELs typically have low threshold currents and can be modulated at high speeds. VCSELs also couple well with optical fibers.

VCSELs are typically made from GaAs semiconductor materials as opposed to InP materials because GaAs semiconductor materials make better multi-layer mirror systems than InP materials. A VCSEL typically requires a high reflectivity mirror system because in a VCSEL, the light resonates in a direction that is perpendicular to the pn-junction. The cavity or active region of a VCSEL is thus relatively short and a photon has little chance of stimulating the emission of an additional photon with a single pass through the active region. To increase the likelihood of stimulating the emission of photons, VCSELs require highly efficient mirror systems such that a photon can make multiple passes through the active region. The reflectivity requirement of VCSELs cannot be satisfied or achieved with metallic mirrors.

VCSELs thus employ Distributed Bragg Reflector (DBR) layers as mirrors. DBR layers are formed or grown using, for example, semiconductor or dielectric materials. DBR layers are grown or formed such that each layer has a refractive index that is different from the refractive index of adjoining layers. The junctions between the DBR layers that are grown in this fashion cause light to be reflected. The amount of light reflected, however, by a single junction is relatively small and dependent on the variance between the relative refractive indices of the adjoining materials. For this reason, a relatively large number of DBR layers are formed in a VCSEL in order to achieve high reflectivity. VCSELs, for example, often have on the order of 50 to 100 DBR layers in order to achieve sufficient reflectivity. The large number of DBR layers also increases the resistance of the VCSEL and may lead to problems with both heat during operation and the growth or formation of the layers.

Another problem associated with VCSELs is related to the wavelength of the light that is generated. Most VCSELs generate light that has a wavelength of approximately 0.85 microns. This wavelength is primarily useful in very short distance fiber optic communications but is typically inadequate for longer distance fiber optic networks such as telecommunication networks. Attempts to develop and fabricate VCSELs that operate at longer wavelengths (1.3 microns and 1.55 microns, for example) have proven to be very difficult. This difficulty is related to the fact that InP materials permit the growth of a suitable active region, but the DBR layers are not effective. When GaAs materials are used, the growth of the DBR layers is straightforward, but the active region is unsuitable. These attempts have resulted VCSELs that produce insufficient power or are unreliable.

VCSELs that generate light at longer wavelengths such as 1.3 and 1.55 microns, which are useful in longer distance optical communication networks, are difficult to fabricate. Some of the reasons that VCSELs that emit longer wavelengths are difficult to fabricate and design include the requirement of successfully designing and forming many DBR layers, the need for the lattice structures of the various layers in the VCSEL to match, and the complexity of growing the DBR layers successfully.

BRIEF SUMMARY OF THE INVENTION

These and other limitations are overcome by the present invention, which relates to vertical cavity surface emitting lasers and to methods of fabricating vertical cavity surface emitting lasers. The present invention forms at least one of the mirror layers of a VCSEL using photonic crystals or a combination of photonic crystals and Distributed Bragg Reflector (DBR) layers.

A photonic crystal or layer is a material, such as a semiconductor material or a dielectric material, that has cavities or apertures or other structure that is formed in the material. The photonic crystal is typically formed such that the cavity structure is periodic. The periodic cavity structure of a photonic crystal is similar to the atomic lattice structure of various materials, but on a larger scale. The periodic cavity structure of a photonic crystal is not confined to the atomic lattice structure of the material and can be formed as required using various configurations and shapes. Because the photonic crystals used in the present invention are planar in nature, the periodic cavity structure is usually two dimensional, although a three dimensional photonic crystal is contemplated by the present invention.

In one example, an active region is formed between photonic crystals. The photonic crystals provide the necessary reflectivity such that photons are reflected between the photonic crystals through the active region, which results in stimulated emission of photons at the corresponding wavelength of the incident photon. The photonic crystals can be combined with DBR layers in other embodiments to provide alternative mirror systems. With a photonic crystal or layer, however, the number of DBR layers is typically reduced.

The VCSEL can be tuned to produce different wavelengths by varying attributes or characteristics of the photonic crystal. Exemplary attribute changes include, but are not limited to, changing the cavity structure to another configuration, altering the shape of the individual cavities, adding another photonic crystal, and the like or any combination thereof. With photonic crystals as mirrors, longer wavelengths can be generated by the VCSEL. The VCSEL can be designed to emit different wavelengths, for example, by using various combinations of cavity shape, cavity structure, cavity orientation, photonic crystal material, and the like. The VCSEL can also be configured to emit a particular wavelength by controlling the refractive index of the photonic crystal by filling the cavities with some material. Additional layers of photonic crystals may extend the band of wavelengths for which high reflectivity is achieved.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which:

FIG. 1A is a perspective view of a photonic crystal or layer with a square periodic cavity structure;

FIG. 1B is a top view of a photonic crystal or layer that has a honeycomb periodic cavity structure;

FIG. 1C is a top view of a photonic crystal or layer that has a rhombic periodic cavity structure;

FIG. 2 illustrates a vertical cavity surface emitting laser where the mirror layers are formed from photonic crystals;

DETAILED DESCRIPTION OF THE PREFERRED EMBODIMENTS

Figure 3:
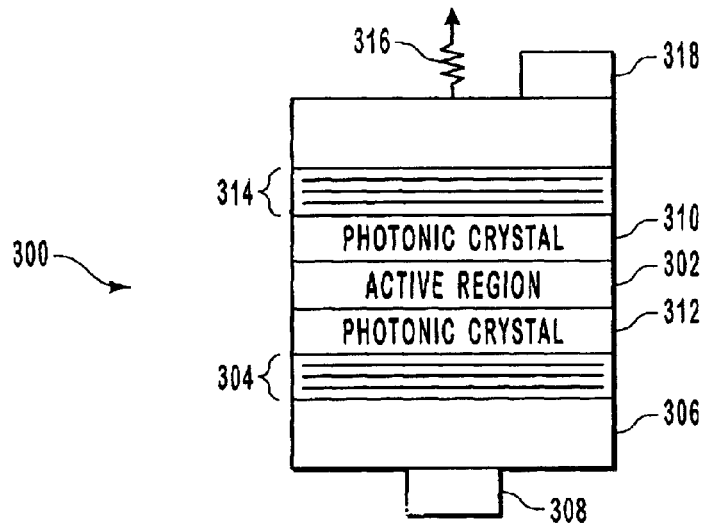
FIG. 3 illustrate a vertical cavity surface emitting laser where the mirror layers are formed from a combination of photonic crystals and distributed Bragg Reflector layers.

Semiconductor lasers are some of the most common light sources in optical networks. At a basic level, semiconductor lasers are essentially pn-junctions that convert electrical energy into light energy. Typically, a gain medium or active region is formed at the pn-junction between the p-type semiconductor material and the n-type semiconductor material. Often, the active region includes quantum wells that can be either compressively or tensile strained quantum wells. The active region may also include quantum dots.

In vertical cavity surface emitting lasers (VCSELs), mirrors are usually formed both above and below the active region. The mirrors reflect light or photons back and forth the through the active region. Within the VCSEL cavity that is effectively bounded by the mirrors or by this mirror system, the light resonates vertically or perpendicularly to the pn-junction. Some of the light escapes the mirror system and emerges from a surface of the VCSEL. Because the light is resonating vertically, the cavity length of a VCSEL is often very short with respect to the direction of light travel. The length of the cavity thus has an effect on the ability of a photon to stimulate the emission of additional photons, particularly at low carrier densities.

To overcome this problem, the mirrors or the mirror system of a VCSEL must be highly efficient and this high reflectivity requirement cannot be achieved through the use of metallic mirrors. VCSELs currently employ, for example, Distributed Bragg Reflector (DBR) layers. DBR layers are formed by forming or growing alternating layers of materials whose refractive index varies. These alternating layers are often formed or grown from semiconductor material or dielectric materials. Light is reflected at the junction of these materials and in order to achieve the high reflectivity required by VCSELs, many layers must be formed or grown as previously discussed.

VCSELs that operate at wavelengths on the order of 1.3 to 1.55 micrometers, as previously stated, are very difficult to manufacture or fabricate. The difficulty in fabricating VCSELs that generate light at these longer wavelengths is often related, for example, to the atomic lattice structure of the materials, the quality of the active region, the reflectivity of the mirror systems, and the type of composition of the material.

The present invention relates to a vertical cavity surface emitting laser and to methods of fabricating or manufacturing vertical cavity surface emitting lasers that generate or produce light at higher wavelengths. In the present invention, the mirror system or mirror layers of VCSELs are achieved using photonic crystals or using a combination of fewer DBR layers and photonic crystals.

A photonic crystal is a material that has a cavity structure that is related to the wavelengths emitted by the VCSEL and FIG. 1A illustrates an exemplary photonic crystal or layer. A plurality of cavities that are periodic in nature are formed or structured in the photonic crystal 100. Cavities 102 and 104 are examples of the cavities that are thus formed in the photonic crystal 100. Each cavity typically passes through the photonic crystal 100. This causes the photonic crystal 100 to have a perforated quality in this example. It is possible for the cavity structure to be formed such that the photonic crystal 100 is not perforated by cavities. In another example, the cavities may extend into other layers of the VCSEL. The cavities are formed or placed in the photonic crystal 100 using an appropriate cavity structure that can vary according to the desired wavelength. The distance between cavities in the cavity structure may be related to the wavelengths of laser light that are generated by the VCSEL. In one example, the photonic crystal enables VCSELs to generate wavelengths on the order of 1.3 to 1.55 microns more easily.

The wavelengths emitted by a VCSEL can be altered by changing characteristics or attributes of the photonic crystal. Characteristics or attributes than can be changed such that a VCSEL emits a different wavelength(s) include, but are not limited to, the cavity structure, the shape of the cavities, the angle of the cavities with respect to the surface of the photonic crystal, the depth of the cavities, the material from which the photonic crystal is formed, the thickness of the photonic crystal, and the like or any combination thereof.

As previously stated, the cavities that are formed in a photonic crystal are periodic in nature or repeating. Examples of the periodic structure of the cavities in the photonic crystal 100 is thus illustrated in FIGS. 1A, 1B and 1C. FIG. 1A illustrates cavities that are formed using a square cavity structure as illustrated by the dashed line 105. FIG. 1B illustrates cavities that are formed using a honeycomb cavity structure shown by the dashed line 106 and FIG. 1C illustrates cavities that are formed using a rhombic cavity structure shown by the dashed line 108. The present invention is not limited to these repeating structures but extends to other periodic cavity structures such as triangular cavity structures or other geometric cavity structures.

Cavities are not limited in shape either. The cavities 102 and 104 shown FIG. 1A are circular in shape and form a circular column through the photonic crystal, the cavities 107 and 109 are triangular in shape and form a triangular column through the photonic crystal 100, and the cavities 110 and 111 are square in shape and form a square column through the photonic crystal 100. The periodic cavity structure can be combined with any cavity shape and the present invention contemplates photonic crystals or layers whose cavities are of different shapes. In addition, the cavities may not pass completely through the photonic crystal, but may form a dimpled surface. Alternatively, the cavities may have a depth that extends into other layers of the VCSEL.

FIG. 2 is a block diagram that illustrates generally the structure of a VCSEL in accordance with the present invention. The VCSEL 200 is formed on a substrate 202. In some cases, the light exits the VCSEL through the substrate 202, which is often transparent to the laser light. Usually, one side of the VCSEL is blocked to laser light such that light is only emitted from one side of the VCSEL. A lower mirror layer 204 is formed or grown on the substrate 202. An active region 206 is formed or grown on the mirror layer 204. On the active region 206, an upper mirror layer 208 is grown or formed. As the mirror layers 204 and 208 repeatedly reflect light or photons through the active region 206, the laser light 210 is ultimately generated and exits the VCSEL 200.

The active region 206 is typically formed from a semi-conductor material. The mirror layers 204 and 208 can be formed from or include photonic crystals or layers. The photonic crystals provide the reflectivity required by the VCSEL 200 and are not as difficult to grow as the multiple DBR layers previously discussed. This makes VCSELs easier to fabricate and reduces cost. In addition, VCSELs that emit different wavelengths of light can be fabricated on the same wafer by controlling the cavity structures.

FIG. 3 illustrates another example of a VCSEL 300 that incorporates photonic crystals as part of the mirror layers. In this example, the active region 302 is bounded by a photonic crystal 312 and a photonic crystal 310. The VCSEL 300 also utilizes DBR layers 304 and 314 as part of the mirror layers. The upper mirror layer thus includes the DBR layers 314 and the photonic crystal 310 while the lower mirror layer includes the DBR layers 304 and the photonic crystal 312. When photonic crystals are included as part of the mirror layers, the number of DBR layers can be reduced. In fact, the DBR layers can be omitted in one embodiment. The orientation or location of the photonic crystals with respect to the DBR layers can also be changed. In another embodiment, for example, the active region 302 is bounded by the DBR layers which, in turn, are bounded by the photonic crystals.

Figure 4:
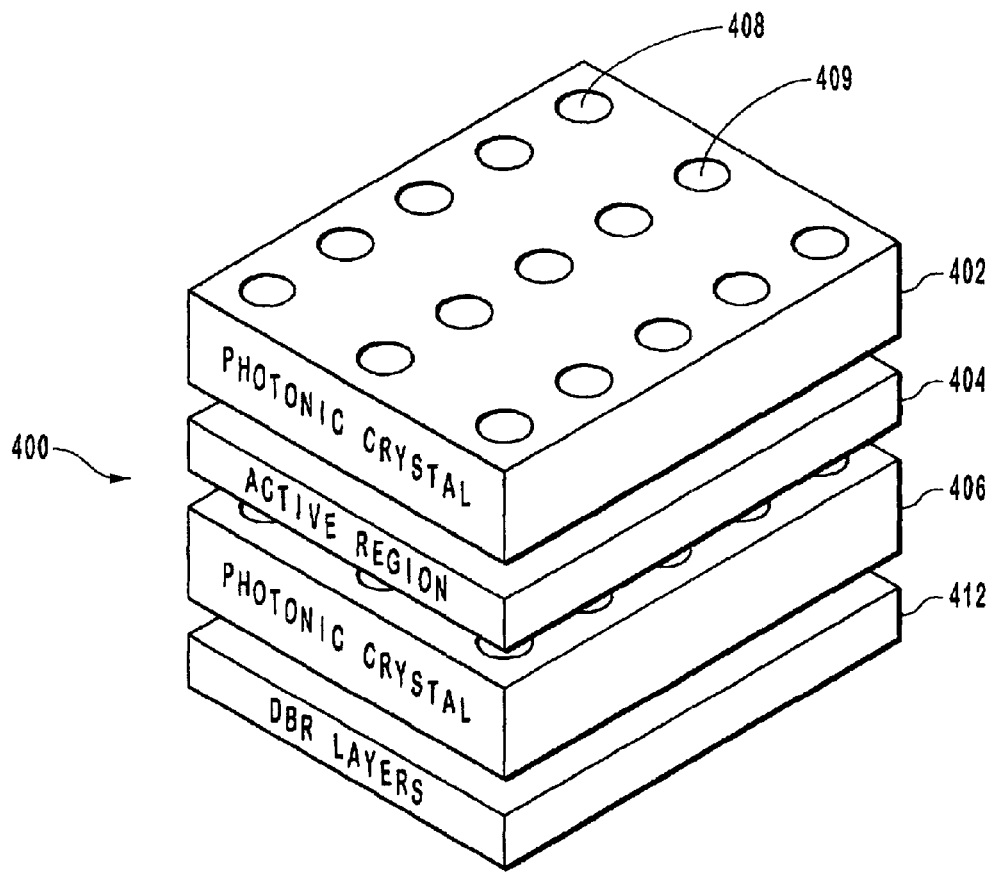
FIG. 4 illustrates an active region of a vertical cavity surface emitting laser, where the active region is bounded by one mirror layer that includes a photonic crystal on one side and by a mirror layer that includes both a photonic crystal and Distributed Bragg Reflector layers on the other side.

FIG. 4 is a perspective view of a VCSEL that uses photonic crystals or layers as mirrors. In this example, the VCSEL 400 includes an active region 404 that is bounded by a photonic crystal 402 and a photonic crystal 406. The photonic crystal 406 is formed on the DBR layers 412. In this example, both the photonic crystal 402 and the photonic crystal 406 have the same periodic cavity structure. The photonic crystal 402 and the photonic crystal 406 have a square cavity structure and the cavities have a circular shape as shown by the cavities 408 and 409.

The photonic crystals 402 and 406, however, are not required to have the same periodic cavity structure. The periodic structure of the cavities selected for the photonic crystal 406 may be affected, for example, by the DBR layers 412. The periodic structure of the cavities on the photonic crystals may also be influenced by the material used to form the photonic crystals. When the cavities of the photonic crystals 402 and 406 are first formed, they typically contain air. However, the present invention contemplates filling the cavities with another material.

The photonic crystals can be formed, for example, from GaAs, AlGaAs, InGaAs, InP, GaInAsP, AlGaInAs, InGaAsN, InGaAsSb, and the like. The photonic crystals can also be formed from dielectric materials that can be deposited in a thin film. The material used to fill the cavities also extends to similar materials. The resonance frequency of the photonic crystal can be altered or changed if the refractive index of the material used to form the photonic crystal and/or fill the cavities is tunable.

In another example of the present invention, only one photonic crystal is provided as one of the other mirror layers. The other mirror layer is formed, for example, using DBR layers. In another example of the present invention, more than one photonic crystal is used. The addition of more photonic crystals extends the bandwidth of the VCSEL. More specifically, the upper and/or the lower mirror layer may include more than one photonic crystal. Each photonic crystal may be formed from a different material and each photonic crystal may have a different cavity structure. Other attributes of the photonic crystals, described above, may be independent of other photonic crystals in the VCSEL.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A vertical cavity surface emitting laser comprising:
   a lower mirror layer formed on a substrate, wherein the lower mirror layer comprises a lower photonic crystal having a cavity structure that includes one or more cavities and at least one distributed bragg reflector layer;
   an upper mirror layer; and
   an active region formed between the lower mirror layer and the upper mirror layer wherein photons are reflected between the lower mirror layer and the upper mirror layer through the active region.

2. A vertical cavity surface emitting laser as defined in claim 1, wherein the upper mirror layer further comprises an upper photonic crystal that has a cavity structure.

3. A vertical cavity surface emitting laser as defined in claim 2, wherein the cavity structure of the lower photonic crystal and the cavity structure of the upper photonic crystal are periodic.

4. A vertical cavity surface emitting laser as defined in claim 3, wherein the cavity structure of the lower photonic crystal is substantially the same as the cavity structure of the upper photonic crystal.

5. A vertical cavity surface emitting laser as defined in claim 1, wherein the one or more cavities the lower photonic crystal are filled with air, and wherein the one or more cavities of the upper photonic crystal are filled with air.

6. A vertical cavity surface emitting laser as defined in claim 1, wherein the lower mirror layer comprises a plurality of distributed bragg reflector layers.

7. A vertical cavity surface emitting laser as defined in claim 6, wherein the distributed bragg reflector layers are formed between the active region and the lower photonic crystal.

8. A vertical cavity surface emitting laser as defined in claim 6, wherein the distributed bragg reflector layers are formed between the substrate and the lower photonic crystal.

9. A vertical cavity surface emitting laser as defined in claim 1, wherein the upper mirror layer further comprises one or more distributed bragg reflector layers.

10. A vertical cavity surface emitting laser as defined in claim 2, wherein the upper mirror layer further comprises an extra photonic crystal.

11. A vertical cavity surface emitting laser as defined in claim 1, wherein light with a wavelength of at least 1.3 microns is emitted by the vertical cavity surface emitting laser.

12. A vertical cavity surface emitting laser comprising:
a substrate;
a lower mirror layer formed on the substrate, wherein the lower mirror layer includes a plurality of distributed bragg reflector layers;
an active region formed on the lower mirror layer, wherein the active region is lattice matched to the lower mirror layer; and
an upper photonic crystal that is formed and lattice matched to the active region, wherein the upper photonic crystal includes a plurality of cavities, wherein light is reflected through the active region by the lower mirror layer and the upper photonic crystal such that laser light is produced at a wavelength that is related to a cavity structure of the upper photonic crystal.

13. A vertical cavity surface emitting laser as defined in claim 12, wherein the lower mirror layer further comprises a lower photonic crystal that has a periodic cavity structure, wherein the lower photonic crystal is formed from an n-type semiconductor material and wherein the upper photonic crystal is formed from a p-type semiconductor material.

14. A vertical cavity surface emitting laser as defined in claim 12, wherein the active region comprises a plurality of quantum wells or quantum spots.

15. A vertical cavity surface emitting laser as defined in claim 12, wherein the cavity structure of the lower photonic crystal is a periodic structure and wherein each cavity has a shape that affects the wavelength emitted by the vertical cavity surface emitting laser.

16. A vertical cavity surface emitting laser as defined in claim 15, wherein the cavity structure of the upper photonic crystal is a periodic structure and wherein each cavity has a shape that affects the wavelength emitted by the vertical cavity surface emitting laser, and wherein the periodic structure of the upper photonic crystal is the same as the periodic structure of the lower photonic crystal.

17. A vertical cavity surface emitting laser as defined in claim 13, wherein the plurality of cavities of the lower photonic crystal and the plurality of cavities of the upper photonic crystal are filled with air.

18. A vertical cavity surface emitting laser as defined in claim 13, wherein the cavities of the lower photonic crystal and the cavities of the upper photonic crystal are formed by either dry etching or lithography.

19. A vertical cavity surface emitting laser as defined in claim 13, further comprising one or more distributed bragg reflector layers formed between the lower photonic crystal and the active region.

20. A vertical cavity surface emitting laser as defined in claim 13, further comprising a third photonic crystal formed on the upper photonic crystal.

21. A vertical cavity surface emitting laser as defined in claim 12 wherein light with a wavelength of at least 1.3 microns is emitted by the vertical cavity surface emitting laser.

22. A method for fabricating vertical cavity surface emitting laser, the method comprising:
forming a lower mirror layer on a substrate comprising one or more distributed bragg layers;
forming an active region on the first mirror layer; and
forming an upper mirror layer that includes an upper photonic crystal on the active region such that light is reflected through the active region by the lower mirror layer and the upper mirror layer, wherein a periodic cavity structure is formed in the upper photonic crystal.

23. A method as defined in claim 22, wherein the active region is formed on the one or more distributed bragg layers.

24. A method as defined in claim 22, wherein forming a lower mirror layer on a substrate further comprises:
forming a lower photonic crystal on the one or more distributed bragg layers; and
forming a cavity structure in the lower photonic crystal, wherein the cavity structure of the lower photonic crystal is substantially the same as the cavity structure of the upper photonic crystal.

25. A method as defined in claim 22, further comprising:
forming an additional photonic crystal on either the upper photonic crystal or the lower photonic crystal; and
forming a cavity structure in the additional photonic crystal.

26. A method as defined in claim 24, further comprising changing an index of either the lower photonic crystal or the upper photonic crystal by filling cavities with a material whose refractive index is different than a refractive index of either the lower photonic crystal or the upper photonic crystal.

27. A method as defined in claim 22, wherein light with a wavelength of at least 1.3 microns is emitted by the vertical cavity surface emitting laser.

* * * * *